United States Patent
Lee et al.

(10) Patent No.: US 11,670,967 B1
(45) Date of Patent: Jun. 6, 2023

(54) MULTI-ENVIRONMENTAL CIRCUIT DEVICES

(71) Applicant: Hamilton Sundstrand Corporation, Charlotte, NC (US)

(72) Inventors: Yongduk Lee, Vernon, CT (US); Ankit Gupta, Willimantic, CT (US); Parag M. Kshirsagar, South Windsor, CT (US)

(73) Assignee: Hamilton Sundstrand Corporation, Charlotte, NC (US)

( * ) Notice: Subject to any disclaimer, the term of this patent is extended or adjusted under 35 U.S.C. 154(b) by 0 days.

(21) Appl. No.: 17/739,809

(22) Filed: May 9, 2022

(51) Int. Cl.
*H02J 50/10* (2016.01)
*H02J 50/80* (2016.01)
*H03K 17/14* (2006.01)
*H05K 7/20* (2006.01)
*H02J 50/12* (2016.01)
*H03K 17/687* (2006.01)

(52) U.S. Cl.
CPC .............. *H02J 50/10* (2016.02); *H02J 50/12* (2016.02); *H02J 50/80* (2016.02); *H03K 17/145* (2013.01); *H03K 17/687* (2013.01); *H05K 7/20254* (2013.01); *H05K 7/20372* (2013.01)

(58) Field of Classification Search
CPC ............ H02J 50/10; H02J 50/12; H02J 50/80; H03K 17/145; H03K 17/687; H05K 7/20254; H05K 7/20372

USPC .................................................. 307/104, 650
See application file for complete search history.

(56) References Cited

U.S. PATENT DOCUMENTS

| | | | |
|---|---|---|---|
| 7,777,370 B2 | 8/2010 | Kojor et al. | |
| 7,800,222 B2 | 9/2010 | Schulz et al. | |
| 7,873,316 B2* | 1/2011 | Rhodes | H04B 13/02 367/901 |
| 7,956,566 B2 | 6/2011 | Hauenstein | |
| 9,002,265 B2 | 4/2015 | Wagoner et al. | |
| 9,685,947 B2 | 6/2017 | Chen | |
| 10,317,484 B2 | 6/2019 | Kanakasabai et al. | |
| 10,594,201 B2 | 3/2020 | Dubois et al. | |
| 2010/0250058 A1* | 9/2010 | Steffler | G07C 5/085 375/256 |
| 2012/0175969 A1* | 7/2012 | Maughan | H01F 38/14 307/104 |
| 2018/0342349 A1 | 11/2018 | Mao et al. | |
| 2021/0208617 A1 | 7/2021 | Strydom | |

* cited by examiner

*Primary Examiner* — William Hernandez
(74) *Attorney, Agent, or Firm* — Locke Lord LLP; Daniel J. Fiorello; Joshua L. Jones (57) ABSTRACT

A device can include a first circuit configured to be exposed to a first environment, the first circuit comprising one or more first transfer inductors, and a second circuit isolated from the first circuit and configured to be exposed to a second environment, the second circuit comprising one or more second transfer inductors. The second environment can be a harsh environment. The first circuit and the second circuit can be wirelessly coupled via the one or more first transfer inductors and the one or more second transfer inductors to allow transfer of power and/or signals between the first circuit and the second circuit.

20 Claims, 7 Drawing Sheets

MULTI-ENVIRONMENTAL CIRCUIT DEVICES

FIELD

This disclosure relates to circuits, e.g., configured to be exposed to multiple environments.

BACKGROUND

Certain new power electronics inverter/converter designs include cryogenic temperature portions, which can mitigate thermal limitations and power losses on the operation of aerospace power systems, for example, while significantly reducing size, weight, and power consumption. The challenges of cryogenics temperature operation for active devices, passive devices, and packaging materials is that components exhibit changes in electrical behavior as a function of temperature. These properties may further change if the materials exhibit degradation due to mechanical loading.

Typically, some electronics devices are intended to operate at cryogenics temperatures or easily survive exposure to cryogenics temperatures. The packaging technologies between the electronics and the outside are required to survive multiple extreme low temperature cycles, which combine the challenges of cryogenics temperatures exposure and fatigue at cryogenics temperatures. Typically, a gate driver can include an isolated dc-dc power supply, gate driver integrated chip (IC), and sub-circuit that is specified to operate at low temperatures, e.g., between 125° C. and −55° C. Especially, a gate driver IC and an isolated dc-dc converter are typically located in or near the power device so as to minimize a loop inductance. The power device (e.g., GaN and Si MOSFET) can be cryogenically cooled. Some near devices can be affected by the extremely low temperature. Thus, some design difficulties to survive cryogenics temperatures include how to separate cryogenic and non-cryogenic areas, how to provide a galvanic isolated power, and how to send an isolated gate signal.

Conventional methods and systems have generally been considered satisfactory for their intended purpose. However, there is still a need in the art for improved circuit devices. The present disclosure provides a solution for this need.

SUMMARY

A device can include a first circuit configured to be exposed to a first environment, the first circuit comprising one or more first transfer inductors, and a second circuit isolated from the first circuit and configured to be exposed to a second environment, the second circuit comprising one or more second transfer inductors. The second environment can be a harsh environment. The first circuit and the second circuit can be wirelessly coupled via the one or more first transfer inductors and the one or more second transfer inductors to allow transfer of power and/or signals between the first circuit and the second circuit.

The device can be an isolated gate driver, for example. The first circuit can include one or more control electronics that are not configured to operate in the second environment. The second circuit can include power electronics including one or more power switches configured to operate in the second environment.

The one or more first transfer inductors and the one or more second transfer inductors can include planar inductors. The one or more first transfer inductors can each be a single layer inductor. In certain embodiments, the one or more second transfer inductors can each be a multilayer planar inductor.

The one or more power switches can be MOSFETS (e.g., GaN). Any other suitable power switch type is contemplated herein. The one or more control electronics can be configured to provide gate signals to the one or more power switches via the first and second transfer inductors to control a state of the one or more power switches.

In certain embodiments, each first transfer inductor can include two first windings having a first turn amount and a second turn amount, respectively. In certain embodiments, each second transfer inductor can include two second windings having a third turn amount and a fourth turn amount respectively. In certain embodiments, the first turn amount can be greater than the second turn amount, which can be greater than the third turn amount, which can be greater than the fourth turn amount. In certain embodiments, the first turn amount is 65 turns, the second turn amount is 21 turns, the third turn amount is 20 turns, and the fourth turn amount is 1 turn. Any suitable number of turns for each inductor is contemplated herein (e.g., to provide a desired power/signal transfer).

The distance between the one or more first transfer inductors and one or more second transfer inductors can be set to provide a desired power transfer. For example, in certain embodiments, the desired power transfer can be 2 to 3 watts of power at about 100 kHz frequency.

In certain embodiments, the second environment can be a cryogenic environment. For example, the second environment can have a temperature between about 70K and about 120K. The first environment can have a temperature greater than about 273K, for example.

In certain embodiments, the device can further include a cold plate connected to the second circuit and configured to allow cryogenic flow through a channel in the cold plate. The second circuit and the cold plate can be contained within a housing. The first circuit can be mounted to an outside of the housing to be thermally isolated from the second environment, for example.

In certain embodiments, the one or more control electronics can include a first switch and a second switch configured to control signal flow to the first transfer inductors. The one or more power electronics can further include one or more zener diodes and a gate resistor, for example. Certain embodiments can include a control module configured to provide gate signals to the first switch and the second switch to control a state of the first and second switch. The control module can be configured to sense when a source current becomes opposite, and can be configured to open the first switch and the second switch to short circuit power to the first transfer inductors to avoid transferring power from the first circuit to the second circuit.

These and other features of the embodiments of the subject disclosure will become more readily apparent to those skilled in the art from the following detailed description taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, embodiments thereof will be described in detail herein below with reference to certain figures, wherein.

DETAILED DESCRIPTION

Figure 1:
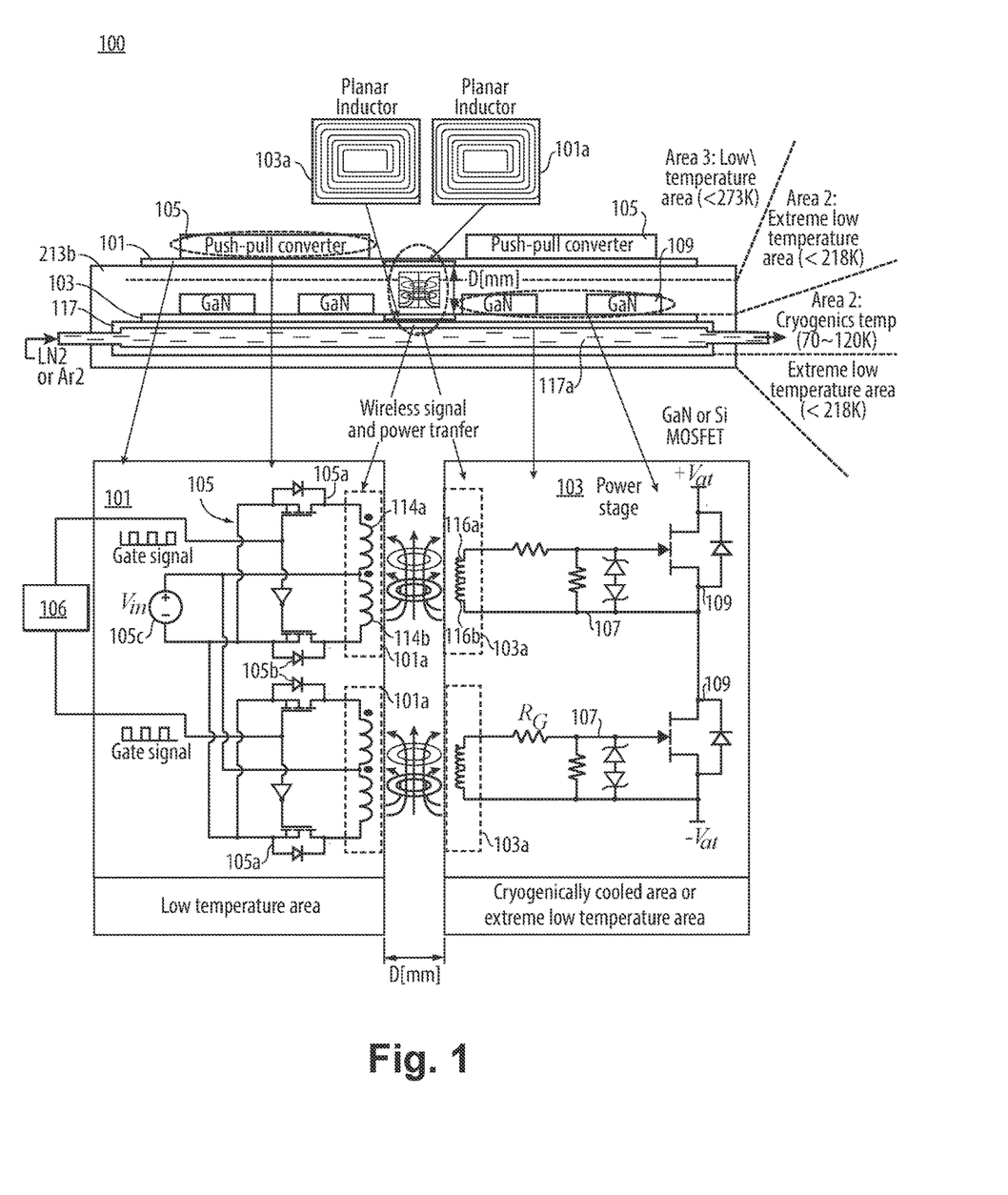
FIG. 1 is a schematic diagram showing a cross-sectional view showing an embodiment of a device in accordance with this disclosure, as well as schematically showing a first circuit and a second circuit having wireless power and signal transfer in accordance with this disclosure.

Reference will now be made to the drawings wherein like reference numerals identify similar structural features or aspects of the subject disclosure. For purposes of explanation and illustration, and not limitation, an illustrative view of an embodiment of a device in accordance with the disclosure is shown in FIG. 1 and is designated generally by reference character 100. Other embodiments and/or aspects of this disclosure are shown in FIGS. 2A-5C.

Referring to FIG. 1, a device 100 can include a first circuit 101 configured to be exposed to a first environment (e.g., ambient air). The first circuit 101 can include one or more first transfer inductors 101a.

The device 100 can include second circuit 103 isolated (e.g., thermally) from the first circuit 101. The second circuit 103 can be configured to be exposed to a second environment (i.e., different than the first environment) and can include one or more second transfer inductors 103a. The second environment can be a harsh environment (e.g., thermally extreme such as a cryogenic environment, and/or any other type of environment that the functionality of one or more components of the first circuit 101 would have reduced functionality).

The first circuit 101 and the second circuit 103 can be wirelessly coupled via the one or more first transfer inductors 101a and the one or more second transfer inductors 103a to allow transfer of power and/or signals between the first circuit 101 and the second circuit 103 (e.g., transmission from the first circuit 101 to the second circuit 103).

In certain embodiments, the device 100 can be an isolated gate driver (e.g., for power systems for aircraft), for example. The first circuit 101 can include one or more control electronics 105 that are not configured to operate in the second environment, for example. The first circuit 101 have a PCB made of FR4, in certain embodiments. Any other suitable material is contemplated herein. In certain embodiments, the one or more control electronics 105 can include a first switch 105a and a second switch 105b configured to control signal flow to the first transfer inductors 101a.

The control electronics 105 can include a voltage source 105c. As shown in FIG. 1, the device 100 can include a plurality of the control electronics 105 (e.g., connected to the voltage source 105c) and a plurality of respective inductors 101a. As shown, each first transfer inductor 105a can be connected between each pair of switches 105a, 105b such that each pair of switches 105a, 105b control a signal to each first transfer inductor 105a. The voltage source 105c can have one terminal connected to the pair of switches 105a, 105b, and a second terminal connected between windings of each first transfer inductor 105a.

Certain embodiments can include a control module 106 configured to provide gate signals (e.g., a PWM signal as shown) to the first switch 105a and the second switch 105b to control a state of the first and second switch 105a, b. In certain embodiments, the control module 106 can include protection logic. For example, the control module 106 can be configured to sense when a source current becomes opposite (e.g., when the current goes negative), and can be configured to open the first switch 105a and the second switch 105b to short circuit power to the first transfer inductors to avoid transferring power from the first circuit to the second circuit. Any suitable protection scheme, e.g., as described below, is contemplated herein. The control module can include any suitable hardware and/or software module(s) configured to perform any suitable function disclosed herein and/or otherwise.

The second circuit 103 can include power electronics 107 including one or more power switches 109 (e.g., GaN MOSFETs) configured to operate in the second environment. The one or more power electronics 107 can further include one or more zener diodes 111a and a gate resistor 111b, for example. Any other suitable components for the second circuit 103 that can operate as desired in a harsh environment are contemplated herein.

The one or more power switches 109 can be MOSFETS (e.g., GaN). Any other suitable power switch type is contemplated herein. The one or more control electronics 105 can be configured to provide gate signals to the one or more power switches 109 via the first and second transfer inductors 101a, 103a to control a state of the one or more power switches 109. As shown, the gate of each power switch 109 can be connected to a respective second transfer inductor 103a to receive signals therefrom. The power switches 109 can be on a power line (e.g., source and drain connected to a high voltage line to selective allow current on the line).

Figure 2A:
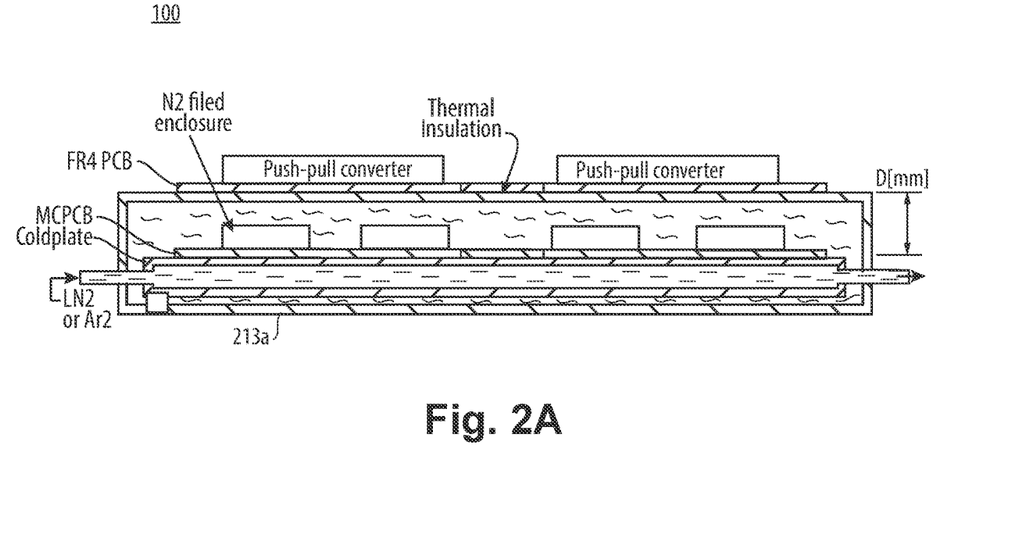
FIG. 2A is a cross-sectional schematic of an embodiment of a device in accordance with this disclosure, shown having a gas filled enclosure (e.g., filled with N2)
Figure 2B:
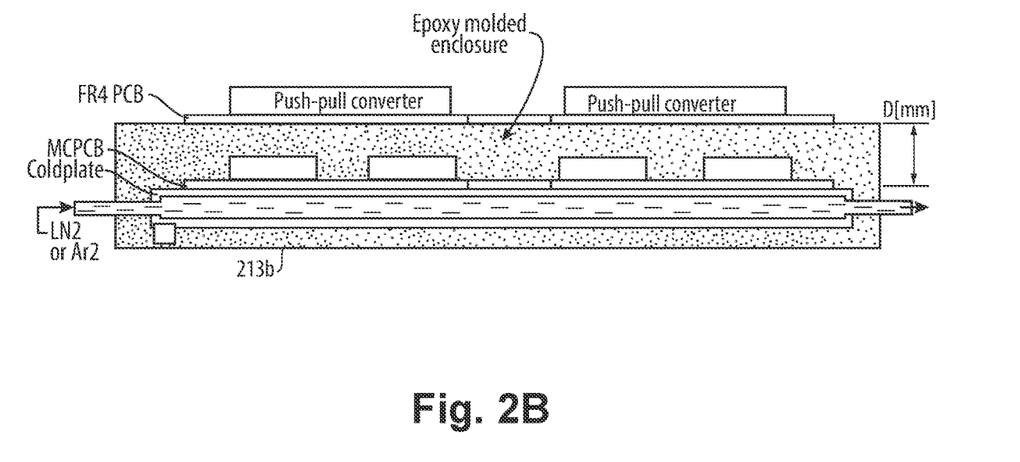
FIG. 2B is a cross-sectional schematic of an embodiment of a device in accordance with this disclosure, shown having an epoxy molded enclosure.
Figure 2C:
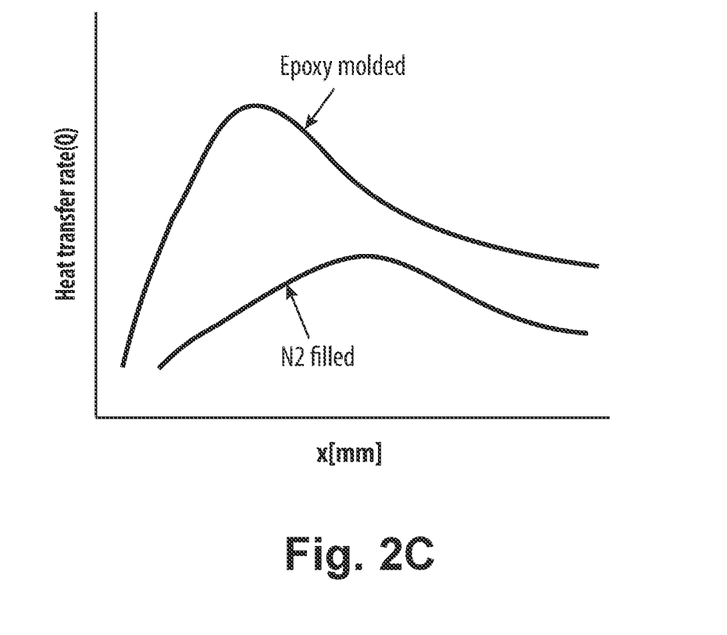
FIG. 2C is a chart showing heat transfer rate vs thickness in certain embodiments.

Referring additionally to FIGS. 2A, 2B, and 2C, the device 100 can have a suitable housing. For example, as shown in FIG. 2A, the device 100 can include a hollow housing 213a configured to be filled with a gas (e.g., N2), containing the second circuit 103. In certain embodiments, as shown in FIG. 2B, the device 100 can include a solid housing 213b (e.g., an epoxy molded enclosure) containing the second circuit 103. Any other suitable housing that isolates the first circuit 101 and the second circuit 103 is contemplated herein.

Figure 3A:
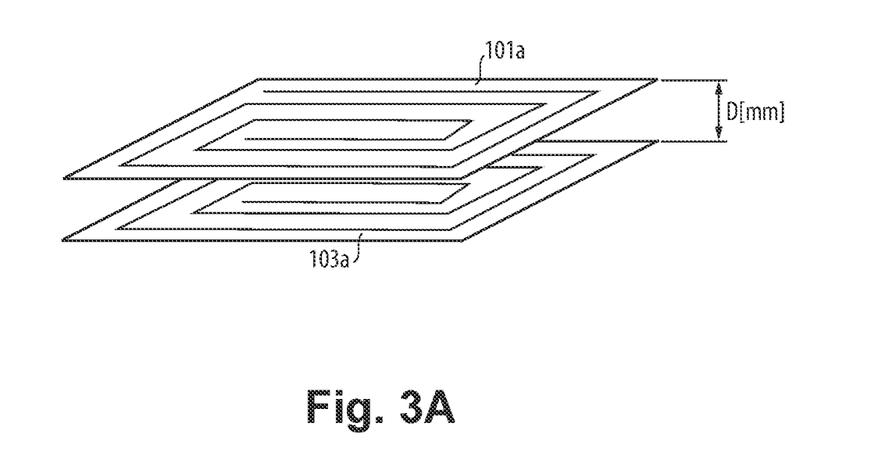
FIG. 3A shows an embodiment of a PCB based planar inductor for wireless signal and power transfer.
Figure 3B:
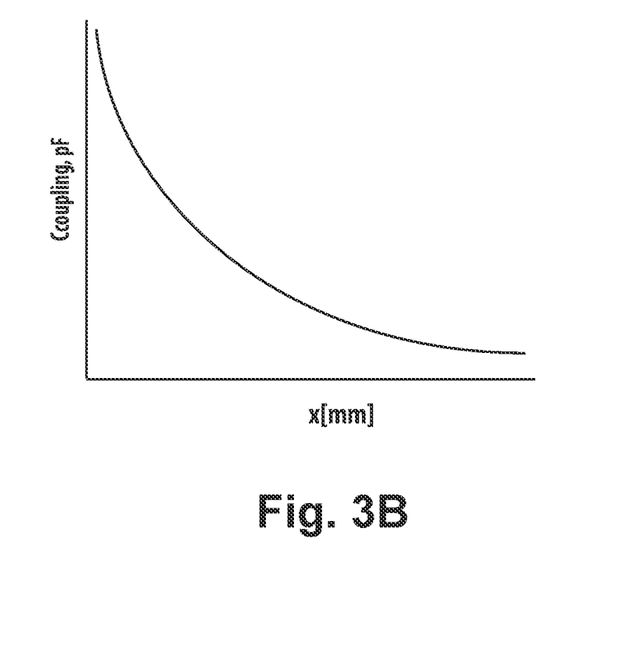
FIG. 3B is a chart illustrating capacitor coupling vs thickness in accordance with this disclosure.
Figure 3C:
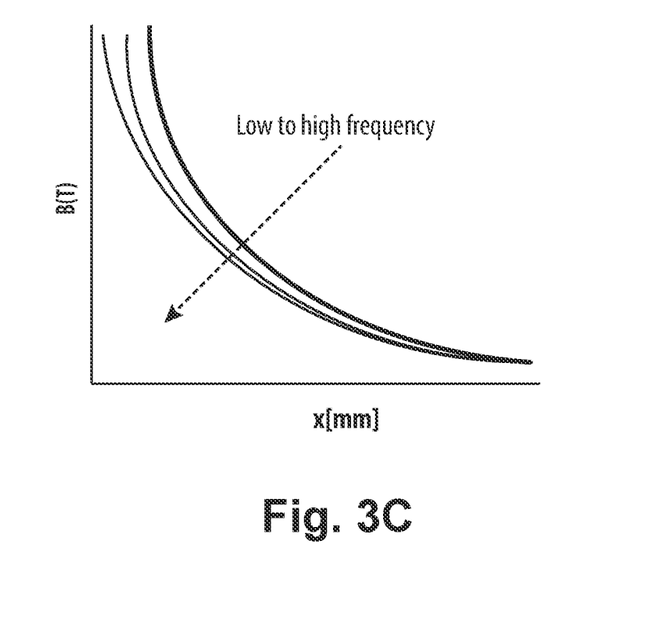
FIG. 3C is a chart showing magnetic field vs thickness in accordance with this disclosure, showing multiple lines indicating the effect of frequency.

In certain embodiments, referring additionally to FIGS. 3A, 3B, and 3C, the one or more first transfer inductors 101a and the one or more second transfer inductors 103a can include planar inductors as shown. The one or more first transfer inductors 101a can each be a single layer inductor, for example. In certain embodiments, the one or more second transfer inductors 103a can each be a multilayer planar inductor (e.g., a smaller area than a respective first transfer inductor 101a, but vertically stacked).

In certain embodiments, each first transfer inductor 101a can include two first windings 114a, 114b having a first turn amount and a second turn amount, respectively. In certain embodiments, each second transfer inductor 103a can include two second windings 116a, 116b having a third turn amount and a fourth turn amount respectively. In certain embodiments, the first turn amount can be greater than the second turn amount, which can be greater than the third turn amount, which can be greater than the fourth turn amount. In certain embodiments, the first turn amount is 65 turns, the second turn amount is 21 turns, the third turn amount is 20 turns, and the fourth turn amount is 1 turn. Any suitable number of turns for each inductor is contemplated herein (e.g., to provide a desired power/signal transfer).

The distance (shown as D or x) between the one or more first transfer inductors 101a and one or more second transfer inductors 103a can be set to provide a desired power transfer. For example, in certain embodiments, the desired power transfer can be 2 to 3 watts of power, e.g., at about 100 kHz frequency of input signal. Any suitable distance for any suitable power transfer is contemplated herein. FIGS. 3B and 3C illustrate the effect of distance on coupling and magnetic field.

In certain embodiments, the second environment can be a cryogenic environment. For example, the second environment can have a temperature between about 70K and about 120K. The first environment can have a temperature greater than about 273K, for example.

In certain embodiments, the device 100 can further include a cold plate 117 connected to the second circuit 103 and configured to allow cryogenic flow (e.g., N2 or Ar2 or any other suitable cryogenic flow) through a channel 117a in the cold plate 117. The second circuit 103 and the cold plate 117 can be contained within a housing 213a, 213b, for example. The first circuit 101 can be mounted to an outside of the housing 213a, 213b to be thermally isolated from the second environment, for example.

In embodiments, GaN or Si MOSFETS can be used for very high power AC/DC converter systems. GaN and Si, for example, become lower resistance with cryogenic cooling. Wireless signal and power transfer allows elimination of certain physical components and integrated circuits within the cryogenic environment that cannot withstand such a harsh environment. Copper line inductors are not affected by cryogenic temperatures, for example.

Embodiments can include only cold temperature robust components, e.g., silicone diodes, resistors, and transfer inductors, and no integrated circuitry. One having ordinary skill in the art in view of this disclosure understands how to select a desired distance between inductors to provide a desired power transfer at a certain frequency, and without undue experimentation, while also allowing for thermal isolation of the first circuit and the second circuit.

Figure 4:
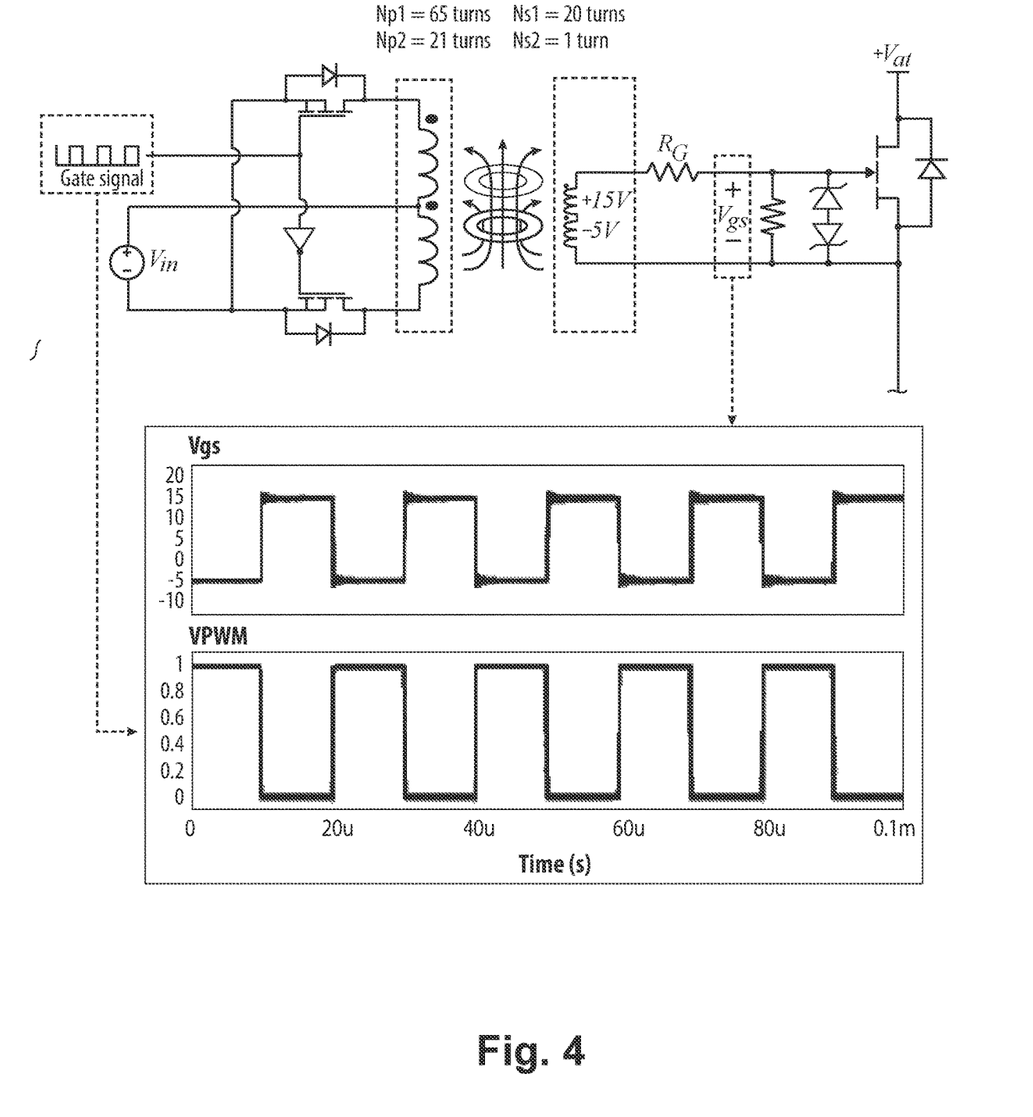
FIG. 4 is a schematic circuit diagram illustrating an embodiment of a push-pull converter for wireless power and signal transfer.
Figure 5A:
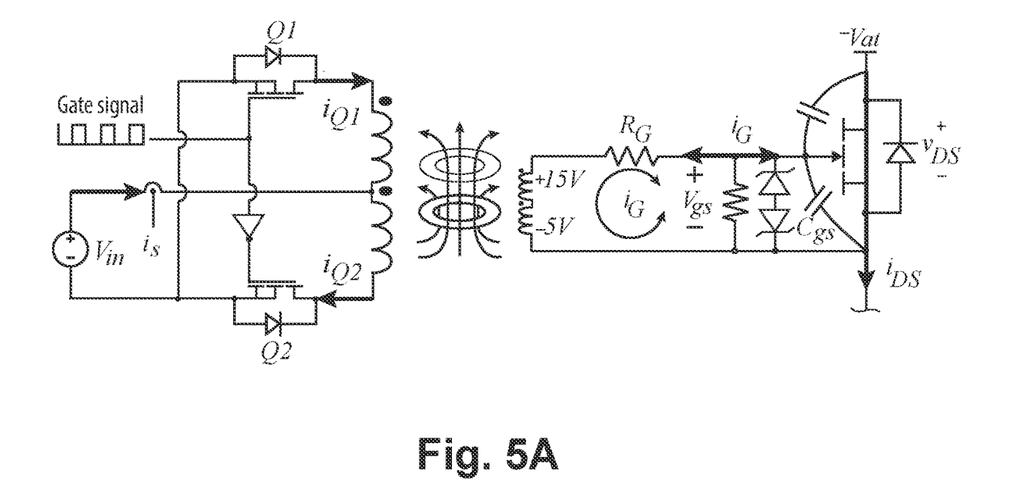
FIG. 5A is a schematic circuit diagram of the embodiment of FIG. 4, illustrating normal operation.
Figure 5B:
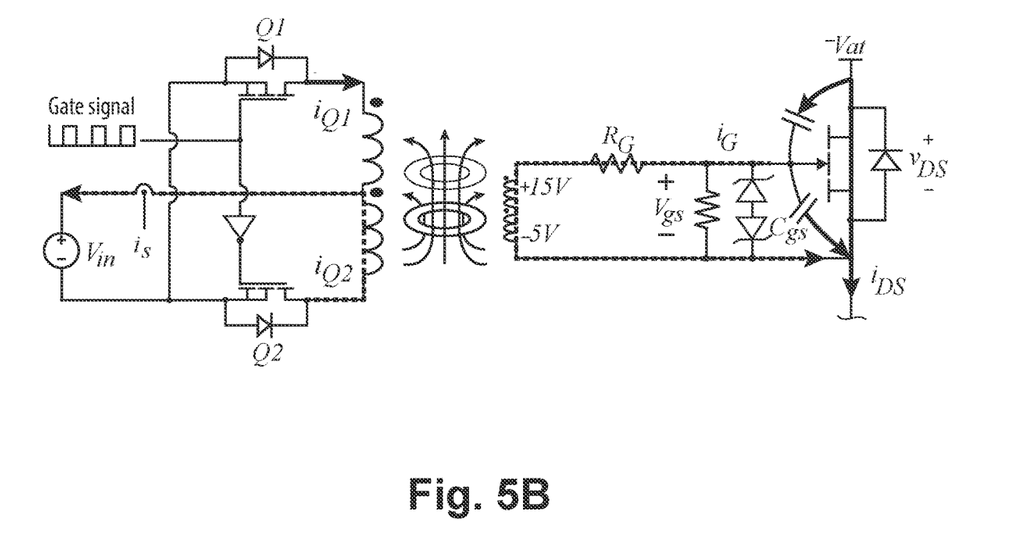
FIG. 5B is a schematic circuit diagram of the embodiment of FIG. 5A, illustrating current flow at short circuit.
Figure 5C:
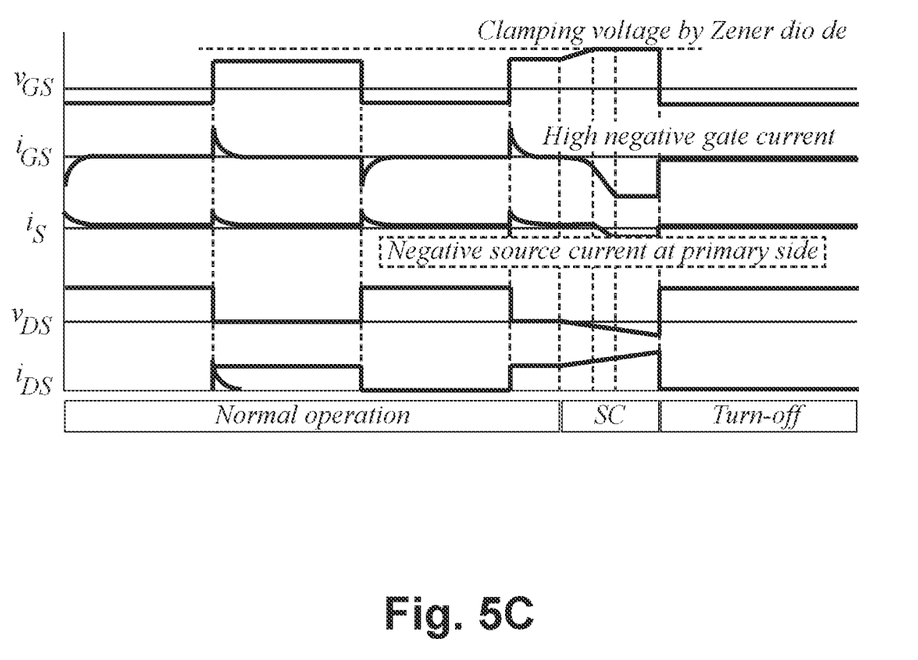
FIG. 5C is a timing chart for the embodiment of FIG. 5A illustrating short circuit protection.

FIG. 1 is a schematic diagram showing a cross-sectional view showing an embodiment of a device in accordance with this disclosure, as well as schematically showing a first circuit and a second circuit having wireless power and signal transfer in accordance with this disclosure. FIG. 2A is a cross-sectional schematic of an embodiment of a device in accordance with this disclosure, shown having a gas filled enclosure (e.g., filled with N2). FIG. 2B is a cross-sectional schematic of an embodiment of a device in accordance with this disclosure, shown having an epoxy molded enclosure. FIG. 2C is a chart showing heat transfer rate vs thickness in certain embodiments. FIG. 3A shows an embodiment of a PCB based planar inductor for wireless signal and power transfer. FIG. 3B is a chart illustrating capacitor coupling vs thickness in accordance with this disclosure. FIG. 3C is a chart showing magnetic field vs thickness in accordance with this disclosure, showing multiple lines indicating the effect of frequency. FIG. 4 is a schematic circuit diagram illustrating an embodiment of a push-pull converter for wireless power and signal transfer. FIG. 5A is a schematic circuit diagram of the embodiment of FIG. 4, illustrating normal operation. FIG. 5B is a schematic circuit diagram of the embodiment of FIG. 5A, illustrating current flow at short circuit. FIG. 5C is a timing chart for the embodiment of FIG. 5A illustrating short circuit protection.

Embodiments can provide an isolated gate driver that uses wireless power and signal transfer in a harsh environment. Embodiments can be used with extreme low temperature applications, especially cryogenic temperatures, or any other suitable harsh environment where components benefit from separation/isolation. Typically, a conventional gate driver could not be worked under cryogenics or extreme lower temperatures. In order to overcome the environment, many methods have been investigated including a special packaging design and a thermally insulated structure. However, it is not easy to meet all requirements, which includes galvanic isolation and a proper gate signal operation under cryogenics temperatures. Thus, this embodiments include an isolated gate driver approach for cryogenically cooled power electronics converter/inverter. However, this approach can be applied to any other harsh environment because this approach can separate the power stage and gate driver board using wireless power and signal transfer.

In order to resolve traditional issues, many methods have been investigated such as a low temperature device packaging and a thermally insulated packaging. The special packaging design that the target is an electronics device and passive components, especially an isolation transformer. In this case, it is necessary to have a special design based on a thermally insulated packaging and a special material. While this method can provide the high reliable operation at the harsh and extreme low temperature, it is a very expensive solution and is not easy to design the individual packaging for each application. Other approaches can include using a thermally insulated structure that has features such as very simple structure and signal/power wiring. An isolated DC-DC converter and gate driver can be located at the outside enclosure, which can be a room temperature area. Thus, off-the shelf parts can be used. However, this method depends on the hard wiring both signal and power. The switching frequency can be limited due to cable length and loop inductance. In order to minimize this impact, a push-pull circuit can be added. However, the push-pull circuit will be exposed at the extreme low temperature if applied traditionally.

FIG. 1 shows an embodiment of the disclosure which can include wireless gate signal and gate power transfer between power semiconductor board and gate driver board, incorporated signal and power signal using push-pull converter and wireless transfer, no COTS gate driver IC on the power semiconductor board and cryogenics environment, thermal isolation between gate driver board and power semiconductor board (e.g., due to insulative housing), high frequency inductive power transfer to achieve a low coupling capacitance based on PCB-based planar inductor, and short circuit protection without any other sub-circuit at the power board and cryogenics environment.

The structure for the wireless power and signal transfer can have three areas. The first area can be the coldplate and semiconductor power board with cryogenics temperature (e.g., about 70K to about 120K). The second area can be the thermal insulation and wireless power and signal transfer with extreme low temperature (e.g., less than about 218K). The third area can be signal and power generation with low temperature (e.g., greater than about 273K).

Embodiments need not include a physical wire connection between circuits. Only passive components and a planar inductor can be placed in the first area. Thus, COTS devices are not affected by the cryogenic temperatures and extreme low temperatures. Thermal insulation thickness and the airgap thickness for the magnetic coupling can be selected to provide desired thermal isolation and wireless transfer performance. For the thermal insulation, two methods can include a gas nitrogen (N2) filled thermally insulated enclosure (e.g., as shown in FIG. 2A) or a molded enclosure (e.g., as shown in FIGS. 1 and 2B). Any suitable insulation materials is contemplated herein (e.g., epoxy).

The airgap thickness for the magnetic coupling can be designed to deliver a desired gate power and signals. Designing of planar coils at a high frequency operation in a compact form can be done. To miniaturize a coil, a multi-layer PCB can be used, e.g., similar to the construction as shown in FIG. 3A. In that case, the coil has a high parasitic capacitance. This can be caused by the inter-turn capacitance due to face-to-face alignment of turns on different layers and side-by-side alignment of turns in the same layer. This lowers its self-resonance frequency. Around the self-resonance frequency, the coil is highly resistive, and at the resonance frequency, it changes from inductive to capacitive characteristics, which makes the design of matching network challenging. Accordingly, in certain embodiments, a single layer planar inductor can be selected for the transmission coil to reduce its parasitic capacitance (e.g., as shown in FIG. 3B) and increase its self-resonance frequency due to transmission coil's large surface area. Since the receiving coil can have a small surface area, it can be made of a plurality (e.g., four) of layers to increase its self-inductance and the mutual inductance between two coils (e.g., as shown in FIG. 4C). To that end, the optimal thickness can be designs for the thermal insulation and wireless power/signal transfer.

The push-pull converter can generate the powered gate signal that includes +/-Vgs, for example. In order to generate negative voltage at the gate-source, a four winding method can be used. FIG. 4 shows a circuit diagram and the output gate-source voltage. The primary side can have two power switches and two winding planar inductor (transmission coils). The secondary side can have two winding planar inductor (receiving coils), a gate resistor and a zener diode, for example.

Typically, short circuit protection includes the following: (1) dSAT, (2) mirror current and (3) di/dt measurement. Approaches can generally include a detection circuit at near power device. Thus, it is not easy to implement a short circuit protection at cryogenic temperatures due to extreme low temperature. In order to avoid the low temperature, embodiments can include a source current detection-based protection. At the short-circuit event, a gate-source voltage can be fluctuated due to a high drain leakage current. Thus, the gate current can be a negative current that is higher than a sourcing current. Thus, the short-circuit can be detected by monitoring a source current in certain embodiments.

FIGS. 5A-5C shows a gate current flow and a timing chart of the short circuit protection. At the normal operation, embodiments can provide +15/-5V gate-source voltage (VGS) that Cgs has a charging/discharging repeatably, as shown in FIG. 5A. The source current (is) has a positive current always as shown in FIG. 5B. FIGS. 5B and 5C show the current flow at the short circuit. At very high drain current, the gate-source voltage (VGS) can be higher than the provided voltage that will be clamped by a Zener diode. Note that a Zener diode protects a gate-source from the over voltage. The gate current has over current compared to the normal sinking current. Thus, the source current (is) has a negative current, as shown in FIG. 5C. The short circuit status can be detected and dealt with.

Embodiments can provide harsh environmental compliance through wireless gate signal and gate power transfer between power semiconductor board and gatedriver board. Embodiments can provide incorporated signal and power signal using single power conversion, which is push-pull converter and wireless transfer. Embodiments can require no COTS gate driver IC on the power semiconductor board and cryogenics environment. Embodiments can be thermally isolated between gate driver board and power semiconductor board. Embodiments can use high frequency inductive power transfer to achieve a low coupling capacitance based on PCB-based planar inductor. Embodiments can provide short circuit protection without any other sub-circuit at the power board and cryogenics environment.

Typically, a conventional gate driver could not be worked under cryogenics or extreme lower temperatures. In order to overcome the environment, many methods have been investigated including a special packaging design and a thermally insulated structure. However, it is not easy to meet all requirements, which include a galvanic isolation and a proper gate signal operation under cryogenics temperatures. Embodiments presents an isolated gate driver using wireless power and signal transfer in a harsh environment.

Embodiments can include any suitable computer hardware and/or software module(s) to perform any suitable function (e.g., as disclosed herein).

As will be appreciated by those skilled in the art, aspects of the present disclosure may be embodied as a system, method or computer program product. Accordingly, aspects of this disclosure may take the form of an entirely hardware embodiment, an entirely software embodiment (including firmware, resident software, micro-code, etc.), or an embodiment combining software and hardware aspects, all possibilities of which can be referred to herein as a "circuit," "module," or "system." A "circuit," "module," or "system" can include one or more portions of one or more separate physical hardware and/or software components that can together perform the disclosed function of the "circuit," "module," or "system", or a "circuit," "module," or "system" can be a single self-contained unit (e.g., of hardware and/or software). Furthermore, aspects of this disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of this disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of this disclosure may be described above with reference to flowchart illustrations and/or block diagrams of methods, apparatus (systems) and computer program products according to embodiments of this disclosure. It will be understood that each block of any flowchart illustrations and/or block diagrams, and combinations of blocks in any flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in any flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified herein.

Those having ordinary skill in the art understand that any numerical values disclosed herein can be exact values or can be values within a range. Further, any terms of approximation (e.g., "about", "approximately", "around") used in this disclosure can mean the stated value within a range. For example, in certain embodiments, the range can be within (plus or minus) 20%, or within 10%, or within 5%, or within 2%, or within any other suitable percentage or number as appreciated by those having ordinary skill in the art (e.g., for known tolerance limits or error ranges).

The articles "a", "an", and "the" as used herein and in the appended claims are used herein to refer to one or to more than one (i.e., to at least one) of the grammatical object of the article unless the context clearly indicates otherwise. By way of example, "an element" means one element or more than one element.

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e., "one or the other but not both") when preceded by terms of exclusivity, such as "either," "one of," "only one of," or "exactly one of."

Any suitable combination(s) of any disclosed embodiments and/or any suitable portion(s) thereof are contemplated herein as appreciated by those having ordinary skill in the art in view of this disclosure.

The embodiments of the present disclosure, as described above and shown in the drawings, provide for improvement in the art to which they pertain. While the subject disclosure includes reference to certain embodiments, those skilled in the art will readily appreciate that changes and/or modifications may be made thereto without departing from the spirit and scope of the subject disclosure.

What is claimed is:

1. A device, comprising:
a first circuit configured to be exposed to a first environment, the first circuit comprising one or more first transfer inductors;
a second circuit isolated from the first circuit and configured to be exposed to a second environment, the second circuit comprising one or more second transfer inductors, wherein the second environment is a harsh environment, and wherein the first circuit and the second circuit are wirelessly coupled via the one or more first transfer inductors and the one or more second transfer inductors to allow transfer of power and/or signals between the first circuit and the second circuit.

2. The device of claim 1, wherein the device is an isolated gate driver.

3. The device of claim 2, wherein the first circuit includes one or more control electronics that are not configured to operate in the second environment, and the second circuit includes power electronics including one or more switches configured to operate in the second environment.

4. The device of claim 3, wherein the one or more first transfer inductors and the one or more second transfer inductors include planar inductors.

5. The device of claim 4, wherein the one or more first transfer inductors are each a single layer inductor.

6. The device of claim 5, wherein the one or more second transfer inductors are each a multilayer planar inductor.

7. The device of claim 6, wherein the one or more switches are MOSFETS.

8. The device of claim 7, wherein the one or more control electronics are configured to provide gate signals to the one or more switches via the first and second transfer inductors to control a state of the one or more switches.

9. The device of claim 8, wherein each first transfer inductor includes two first windings having a first turn amount and a second turn amount, respectively, and wherein each second transfer inductor includes two second windings having a third turn amount and a fourth turn amount respectively.

10. The device of claim 9, wherein the first turn amount is greater than the second turn amount, which is greater than the third turn amount, which is greater than the fourth turn amount.

11. The device of claim 10, wherein the first turn amount is 65 turns, the second turn amount is 21 turns, the third turn amount is 20 turns, and the fourth turn amount is 1 turn.

12. The device of claim 9, wherein the distance between the one or more first transfer inductors and one or more second transfer inductors is set to provide a desired power transfer.

13. The device of claim 12, wherein the desired power transfer is 2 to 3 watts of power at about 100 kHz frequency.

14. The device of claim 13, wherein the second environment is a cryogenic environment.

15. The device of claim 14, wherein the second environment has a temperature between about 70K and about 120K.

16. The device of claim 14, wherein the first environment has a temperature greater than about 273K.

17. The device of claim 14, further comprising a cold plate connected to the second circuit and configured to allow cryogenic flow through a channel in the cold plate.

18. The device of claim 17, wherein the second circuit and the cold plate are contained within a housing, wherein the first circuit is mounted to an outside of the housing to be thermally isolated from the second environment.

19. The device of claim 18, wherein the one or more control electronics include a first switch and a second switch configured to control signal flow to the first transfer inductors, wherein the one or more power electronics include one or more zener diodes and a gate resistor.

20. The device of claim 19, further comprising a control module configured to provide gate signals to the first switch and the second switch to control a state of the first and second switch, wherein the control module is configured to sense when a source current becomes opposite, and is configured to open the first switch and the second switch to short circuit power to the first transfer inductors to avoid transferring power from the first circuit to the second circuit.

* * * * *